(12) United States Patent
Ben Chouikha et al.

(10) Patent No.: US 10,886,322 B2
(45) Date of Patent: Jan. 5, 2021

(54) MULTI-SPECTRAL SENSOR WITH STACKED PHOTODETECTORS

(71) Applicant: SORBONNE UNIVERSITÉ, Paris (FR)

(72) Inventors: Mohamed Ben Chouikha, Aubervilliers (FR); Gérard Dubois, Combs-la-Ville (FR)

(73) Assignee: SORBONNE UNIVERSITÉ, Paris (FR)

( * ) Notice: Subject to any disclaimer, the term of this patent is extended or adjusted under 35 U.S.C. 154(b) by 0 days.

(21) Appl. No.: 16/470,515

(22) PCT Filed: Dec. 18, 2017

(86) PCT No.: PCT/EP2017/083392
§ 371 (c)(1),
(2) Date: Jun. 17, 2019

(87) PCT Pub. No.: WO2018/114854
PCT Pub. Date: Jun. 28, 2018

(65) Prior Publication Data
US 2019/0312078 A1    Oct. 10, 2019

(30) Foreign Application Priority Data

Dec. 20, 2016    (FR) ..................... 16 62932

(51) Int. Cl.
*H01L 31/00*    (2006.01)
*H01L 27/146*    (2006.01)
(Continued)

(52) U.S. Cl.
CPC .... *H01L 27/14647* (2013.01); *H01L 27/1446* (2013.01); *H01L 27/14652* (2013.01);
(Continued)

(58) Field of Classification Search
CPC .......... H01L 27/14647; H01L 27/1446; H01L 27/14652; H01L 31/0224
(Continued)

(56) References Cited

U.S. PATENT DOCUMENTS

| 5,883,421 A | 3/1999 | Ben Chouikha et al. |
| 7,619,267 B2 * | 11/2009 | Araki ............... H01L 27/14603 257/233 |
| 2014/0374866 A1 | 12/2014 | Lin |

FOREIGN PATENT DOCUMENTS

WO    2005/119790 A1    12/2005

OTHER PUBLICATIONS

Written Opinion of the International Searching Authority dated Feb. 16, 2018, issued in corresponding International Application No. PCT/EP2017/083392, filed Dec. 18, 2017, 4 pages.
(Continued)

*Primary Examiner* — Tan N Tran
(74) *Attorney, Agent, or Firm* — Christensen O'Connor Johnson Kindness PLLC (57) ABSTRACT

A multi-spectral photodetector is provided, comprising: a plurality of N photodetectors where N is an integer such that N≥2, each photodetector comprising an anode and a cathode separated from one another by a region of interest, all produced in a semiconductor material; at least one electrical contact for all of the N anodes; and an electrical contact associated with each of the N cathodes; said photodetectors being stacked on top of one another such that the anodes and the cathodes and finally the regions of interest of two consecutive photodetectors in the stack are arranged face to face, this stack making it possible to define a face, termed the active face of the multi-spectral photodetector, common to all the photodetectors of the stack, defined by the face of
(Continued)

the first region of interest of the first photodetector of the stack via which photons are intended to enter the stack.

10 Claims, 7 Drawing Sheets

(51) Int. Cl.
*H01L 31/101* (2006.01)
*H01L 31/0224* (2006.01)
*H01L 27/144* (2006.01)
*H01L 31/0352* (2006.01)

(52) U.S. Cl.
CPC .... *H01L 31/0224* (2013.01); *H01L 31/03529* (2013.01); *H01L 31/1013* (2013.01)

(58) Field of Classification Search
USPC ........................................................ 257/440
See application file for complete search history.

(56) References Cited

OTHER PUBLICATIONS

International Preliminary Report on Patentability dated Jun. 25, 2019, issued in corresponding International Application No. PCT/EP2017/083392, filed Dec. 18, 2017, 1 page.

International Search Report dated Feb. 16, 2018, issued in corresponding International Application No. PCT/EP2017/083392, filed Dec. 18, 2017, 2 pages.

Written Opinion of the International Searching Authority dated Feb. 16, 2018, issued in corresponding International Application No. PCT/EP2017/083392, filed Dec. 18, 2017, 5 pages.

Topič, M., et al., "Stacked A-SI:H-Based Three-Colour Detectors", Journal of Non-Crystalline Solids, 227/230:1326-1329, May 1998.

* cited by examiner

MULTI-SPECTRAL SENSOR WITH STACKED PHOTODETECTORS

The invention concerns a multi-spectral sensor.

Conventional colour and/or multi-spectral sensors, of the CCD or CMOS type for example, require a set of optical filters or an optical dispersion system for measuring the colour and/or the spectral composition of an incident radiation. The quality of the image thus obtained by the spectral breakdown is therefore degraded by the rasterisation performed by the optical filters. This rasterisation is responsible, for example, for the phenomenon of moiré patterns appearing in colour images having high spatial frequencies.

Furthermore, with these conventional multi-spectral sensors, the resolution obtained is also limited due to the fact that a plurality of photodetectors of the multi-spectral sensor is used in order to detect a colour.

It was therefore sought to solve these problems.

A solution to these problems is proposed in U.S. Pat. No. 5,883,421 (D1), for example.

In D1, the proposed multi-spectral sensor is based on a completely different technique, known as buried junctions.

However, this technique has certain limitations.

In particular, the difference in doping between two successive semiconductor regions of different type (n and p) must be of the order of two decades in order to obtain defined and reproducible junction depths, as well as a significant SCR (Space Charge Region).

Furthermore, the coordination of successive regions of different types (n and p) is achieved by introducing, for each region, a concentration of additional impurities in order to produce the desired doping. The concentration of impurities introduced does not cease to increase and can rapidly reach the limit of impurities that can be introduced into the semiconductor.

In practice, this limits the manufacture to a few buried junctions, namely not more than five. Consequently, the number of wavelengths of interest that can be analysed is limited.

Furthermore, the electron-hole pairs generated in the neutral regions of a buried junction only participate partially in the generation of photocurrents. Consequently, the quantum yield of such a multi-spectral sensor is limited.

Moreover, the temporal response of such a multi-spectral sensor is limited by the diffusion currents, which are in general larger than the through-currents, and by the non-negligible values of the junction capacitances.

Finally, it should be noted that whether for a conventional CCD or CMOS technique or for a more advanced so-called buried junction technique, it is not possible to take a multi-spectral image in a single shot.

A problem addressed by the invention is that of solving at least one of the above-mentioned disadvantages.

To this effect, the invention proposes a multi-spectral sensor comprising:
  a plurality of N photodetectors where N is an integer with N≥2, each photodetector comprising an anode and a cathode separated from one another by a region of interest, the anode and the cathode and the region of interest all being made of a semiconductor material;
  said photodetectors being stacked on one another such that the anodes and the cathodes and finally the regions of interest of two consecutive photodetectors in the stack are arranged face-to-face, this stack making it possible to define a face, termed the active face, of the multi-spectral sensor, common to all the photodetectors of the stack, defined by the face of the first region of interest of the first photodetector of the stack via which photons are intended to enter the stack; and
  either, in a first case, an electrical contact associated with each of the N cathodes and at least one electrical contact for the N anodes, the consecutive cathodes in the stack, arranged face-to-face, then being separated by an insulating layer;
  or, in a second case, an electrical contact associated with each of the N anodes and at least one electrical contact for the N cathodes, the consecutive cathodes in the stack, arranged face-to-face, then being separated by an insulating layer.

This multi-spectral sensor can include at least one of the following features:
  it comprises, between two consecutive photodetectors in the stack, an insulating layer separating the regions of interest arranged face-to-face;
  each photodetector comprises, within the associated region of interest, a strip which is, in the first case, at least in contact with the cathode concerned and produced with a doping of the same type as this cathode, said strip extending, within the region of interest, towards the anode; in the second case, at least in contact with the anode concerned and produced with a doping of the same type as this anode, said strip extending, within the region of interest, towards the cathode;
  the or each strip has a thickness between 10 nm and 50 nm;
  it has a concentration gradient in the doping of the semiconductor material of the region of interest of the first photodetector of the stack, situated at said active face;
  it also comprises a passivation layer on said active face;
  the passivation layer is produced with an oxide or glass comprising phosphorus;
  an insulating layer is provided, for example produced with an oxide, in the first case, between each electrical contact of the cathode and the associated cathode, in order to form a capacitor between the electrical contact of the cathode and the associated cathode; in the second case, between each electrical contact of the anode and the associated anode in order to form a capacitor between the electrical contact of the anode and the associated anode;
  for each photodetector, the region of interest is produced from an intrinsically doped semiconductor material;
  for each photodetector, the anode is produced from a P+ doped semiconductor material and the cathode is produced from an N+ doped semiconductor material.

Other features, goals and advantages of the invention will emerge on reading the description with reference to the attached drawings given by way of example, wherein.

Figure 1:
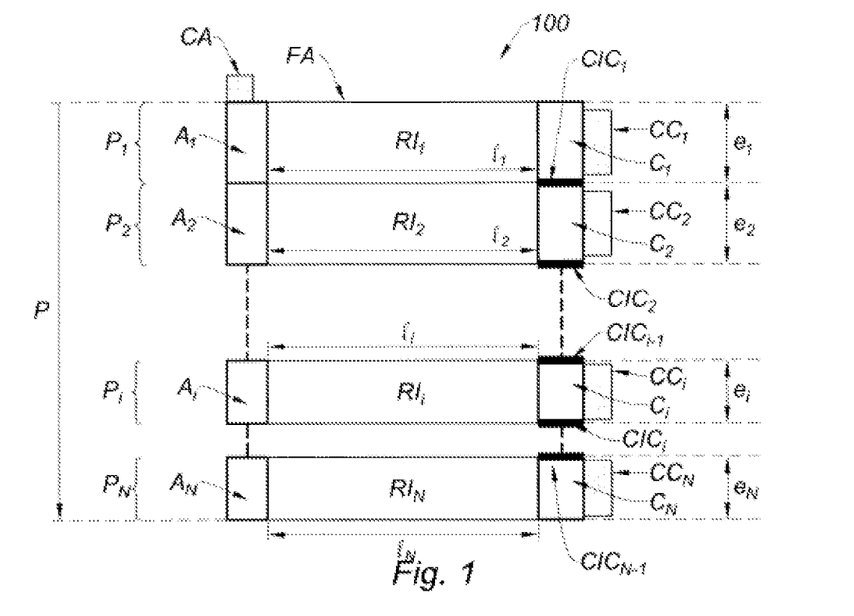
FIG. 1 illustrates a first embodiment of a multi-spectral sensor in accordance with the invention.

A first embodiment of a multi-spectral sensor in accordance with the invention is illustrated in FIG. 1.

The multi-spectral sensor 100 comprises a plurality of N photodetectors $P_1, \ldots, P_N$ where N is an integer such that $N \geq 2$. Each photodetector comprises an anode $A_1, \ldots, A_N$ and a cathode $C_1, \ldots, C_N$, separated from each other by a region of interest $R_{I1}, \ldots, R_{IN}$. Moreover, for each photodetector $P_1, \ldots, P_N$, the anode, the cathode and the region of interest are all made of a semiconductor material.

The multi-spectral photodetector 100 also comprises at least one electrical contact CA for all of the N anodes $A_1, \ldots, A_N$ as well as an electrical contact $CC_1, \ldots, CC_N$ associated with each of the N cathodes.

In this case, and as illustrated in FIG. 1, a common electrical contact CA is provided for all of the anodes $A_1, \ldots, A_N$. In practice, each electrical contact $C_A$, $CC_1, \ldots, CC_N$ can be produced in a material chosen from a metal, a metal alloy or made from a degenerately doped polycrystal, such as polycrystalline silicon. The photocurrents (or the photogenerated charges) in each photodetector $P_1, \ldots, P_N$ are collected via the corresponding electrical contact $CC_1, \ldots, CC_N$. Photocurrents are thus collected separately without any redistribution of charges between the cathodes.

Each photodetector has a PIN structure.

In the context of the invention, the photodetectors $P_1, \ldots, P_N$ are moreover also stacked on top of one another so that the anodes $A_1, \ldots, A_N$) and the cathodes $(C_1, \ldots, C_N)$ and finally the regions of interest $R_{I1}, \ldots, R_{IN}$, of two consecutive photodetectors in the stack are arranged face-to-face. In other words, if two photodetectors $P_i, P_{i+1}$, where $1 \leq i \leq N-1$, of this stack are considered, the anodes $A_i$, $A_{i+1}$ face each other, the cathodes $C_i, C_{i+1}$ face each other and the regions of interest $RI_i, RI_{i+1}$ also face each other.

In order to insulate the cathodes which face each other, an insulating layer $CIC_1, CIC_2, \ldots, CIC_{i-1}, CIC_i, \ldots, CIC_{N-1}$ is provided between two cathodes which face each other. This makes it possible to avoid the photocurrents generated in a given photodetector $P_i$ being collected by a cathode associated with another photodetector. Each of these insulating layers can be produced by an ion implantation, for example with a P+ type doping on the corresponding cathode Due to this stack, it is seen that there is a face, called the active face FA, of the multi-spectral sensor 100, that is common to all the photodetectors of the stack, and defined by the face of the first region of interest $RI_1$ of the first photodetector $P_1$ of the stack, via which photons are intended to enter the stack.

With this stack, certain geometric parameters of the multi-spectral sensor 100 can be represented.

Thus, it is possible to define, for the $i^{th}$ photodetector of the stack, a distance d where $1 \leq i \leq N$, taken between the active face FA and the $i^{th}$ photodetector $P_1, \ldots, P_N$ of the stack (the special case of $d_1=0$ should be noted). This distance $d_i$ defines the depth at which the $i^{th}$ photodetector of the stack is situated within the multi-spectral sensor 100.

It is also possible to define the thickness $e_i$ of a photodetector $P_i$, this thickness being notably that of a region of interest of this photodetector $P_i$. This thickness is expressed as $e_i = d_{i+1} - d_i$ where $1 \leq i \leq N$, and is consequently taken in the direction of the depth of the multi-spectral photodetector 100 (it should be noted that the distance $d_{N+1}$ corresponds to the distance separating the active face FA of the multi-spectral photodetector 100 from its bottom face FF). Typically, this thickness $e_i$ of a region of interest $RI_1, \ldots, RI_N$ may be between several tens of nm and several micrometres, for example between 20 nm and 5 microns.

In practice, each region of interest of the stack absorbs wavelengths according to a "bell" curve centred on the wavelength of interest (wavelength of the peak of the bell curve).

Once the nature of the semiconductor material is chosen, the depth $d_i$ at which a photodetector $P_i$, where $1 \leq i \leq N$, is situated within the stack and the thickness $e_i$ of this photodetector $P_i$, and more precisely of a region of interest $RI_i$, where $1 \leq i \leq N$, make it possible to determine the wavelength of interest and the width at half height (about the peak) of the "bell" curve, this width at half height defining the wavelength selectivity of the photodetector in question.

It is understood that each photodetector $P_1, \ldots, P_N$ of the stack is dedicated to the detection of a given range of wavelengths of interest and that the multi-spectral nature of the multi-spectral sensor comes from the presence of a plurality of photodetectors stacked as proposed in the context of the invention. It is also understood that the presence of an electrical contact $CC_i$ for each photodetector $P_i$ is important for applying the reverse bias required, and for being able to measure the photogenerated electrical signal in each photodetector.

It should be noted that the arrangement of the multi-spectral sensor 100 makes it possible to detect shorter wavelengths close to the active face FA and increasingly longer wavelengths as the distance $d_i$ of the photodetector increases deeper into the stack.

The semiconductor material forming each photodetector $P_1, \ldots, P_N$ will be chosen depending on the range of wavelengths that it is desired to analyse.

Thus, silicon (Si) can be envisaged for a wavelength range of between 0.2 μm and 1.1 μm, and germanium (Ge) for wavelengths between 0.2 μm and 1.7 μm.

Gallium arsenide (GaAs) can be envisaged for a wavelength range of between 0.2 μm and 0.9 μm.

Other semiconductor materials can be envisaged, such as indium gallium arsenide (InGaAs) for the wavelength range from 1 μm to 1.7 μm, indium arsenide (AsIn) for the wavelength range from 1 μm to 3.5 μm, indium antimonide (InSb) for the wavelength range from 1 μm to 6 μm, or mercury cadmium telluride (HgCdTe) for the wavelength range from 4 μm to 13 μm.

Once the semiconductor material is chosen, the number N of photodetectors $P_1, \ldots, P_N$ will be determined depending on the wavelength range that it is desired to analyse with the multi-spectral sensor 100 and the selectivity of the desired breakdown.

It is therefore possible, in contrast to the technique proposed in document D1, to increase as desired the number N of photodetectors of the stack depending on the spectral breakdown required by the application.

In the context of the invention, the number N of photodetectors of the stack is only limited by the total depth or thickness of the stack which must not exceed a value corresponding to a total absorption of the incident photons. Indeed, beyond a certain total depth or thickness, the photons are totally absorbed and no longer penetrate into the material. In this case, a thicker stack is of no interest.

In practice, in the context of the invention, it is always possible to go well beyond N>10.

Finally, it is possible to define the width $l_i$, where $1 \leq i \leq N$, of a region of interest $R_{I1}, \ldots, R_{IN}$ of each photodetector $P_1, \ldots, P_N$ of the stack. This width $l_i$ is taken perpendicularly to the depth of the stack.

The choice of the width $l_i$ of a photodetector $P_i$ depends on the envisaged application. Certain applications require small photodetectors (still called pixels), in other words having a surface area of 1 μm² to 6 μm², in order to increase the spatial resolution and the definition of the captured image. Other applications require large sensors in order, for example, to increase the sensitivity under low lighting conditions (large surface area image sensors for telescopes, for example). Thus, for an image sensor, this width $l_i$ of a region of interest $RI_1, \ldots, RI_N$ can be between several hundred nanometres and the several microns or even tens of microns, for example between 200 nm and 50 microns. It can also be of the order of several hundred microns for specific sensors, namely between 200 microns and 800 microns. It can be several millimetres to several tens of millimetres, for example between 2 mm and 50 mm, for a single-channel multi-spectral detector.

The envisaged application will therefore define the surface area of the photodetector and, consequently, the value of the length $l_i$ of a region of interest.

However, whatever the application envisaged, the structure proposed in the context of the invention makes it possible to obtain an excellent quantum efficiency (close to a value of unity), and therefore better than that of the multi-spectral sensor proposed in D1.

Indeed, in the context of the invention, the structure of each photodetector (PIN, choice of doping to form this PIN) and, in use, the reverse bias value applied to the photodetector, makes it possible to adjust the SCR so that it extends over the entire length $l_i$. Thus, all the carriers created in a photodetector are separated by the electric field which prevails in the SCR and form the photocurrent which crosses the PIN. The photocurrent component is essentially a transit component and the diffusion component is negligible.

The capacitance of the PIN photodetector depends on the SCR and its value is very precisely proportional to the ratio $e_i/l_i$, due to the fact that in practice the SCR can be adjusted to extend over the entire length $l_i$. Compared with a conventional detector having the same active surface, the capacitance is reduced in the ratio $e_i/l_i$.

Furthermore, and in general, the response time of a photodetector is defined by its capacitance (capacitance of the PIN structure, diode) and its stray resistances, by the transit time of charges in the SCR and by the diffusion time (before arriving at the SCR).

In general, for photodetectors of the prior art, the response time is limited by the diffusion time, which is typically between $10^{-8}$ and $10^{-9}$ s.

However, in the context of the invention, the diffusion time is negligible with respect to the transit time in the SCR.

Still in the context of the invention, the transit time of a photodetector $P_i$ is of order $10^{-11}$ s and the response time due to the capacitance of the photodetector and its stray resistances is estimated at $10^{-16}$ s for a series resistance estimated to vary from 10Ω to 100Ω and a capacitance of 10 nF/cm².

Consequently, in the context of the invention, the response time of the photodetector is ultimately determined by the sole transit time in the SCR of the photodetector $P_i$.

It is therefore possible to improve the response time of a photodetector $P_i$, with respect to that which is proposed in the prior art and in particular in document D1, without any modification in the selectivity of this photodetector $P_i$. As a reminder, this selectivity is determined by the thickness $e_i$, but also by the depth $d_1$. With respect to the response time of the multi-spectral sensor 100 as a whole, this will correspond to the longest response time of a photodetector of the stack.

Typically, the ratio $e_i/l_i$ can be of order 10 for a photodetector $P_i$ at a depth intended to sense long wavelengths and having an active face FA with a small surface area (for example, a thickness $e_i$=5 μm and a width $l_i$=0.5 μm). This ratio $e_i/l_i$ can be of order $10^{-3}$ for a photodetector $P_i$ at the surface (low or zero depth) intended to sense short wavelengths and having an active face with a high surface area (for example, a thickness $e_i$=50 nm and a width $l_i$=50 μm).

Finally, it is understood that, in contrast with the techniques of the prior art, it is possible to carry out multi-spectral analysis in a single shot. Indeed, the stack considered in the context of the invention and the fact that an electrical contact is associated with each cathode, enables this.

Whatever the semiconductor material chosen, the manufacture of the multi-spectral photodetector 100 can start with an epitaxy of the $P_N$ photodetector (the deepest once the stack is produced), starting from an intrinsically doped semiconductor material, for example silicon. The epitaxy conditions make it possible to determine the thickness $e_N$ of a photodetector $P_N$. The anode $A_N$ is then advantageously produced by an ion implantation enabling a P doping to be performed. The cathode $C_N$ is then advantageously produced by an ion implantation enabling an N doping to be performed.

Then, an insulating P+ doping (which corresponds to the layer $CIC_{N-1}$) is performed by an ion implementation above the cathode $C_N$ in order to insulate cathode $C_{N-1}$ from it, it being intended to produce the latter subsequently.

The steps are then repeated in order to produce the other photodetectors $P_{N-1}$ to $P_1$ of the stack.

Then, the electrical contacts are produced by a conventional contact and metallisation method.

The method for manufacturing the multi-spectral sensor 100 will be described in more detail below in the context of a practical example, in particular the way in which the electrical contacts of the different cathodes are arranged in order to be compatible with the "planar" manufacturing technologies of CI, CMOS or BiCMOS.

Figure 2:
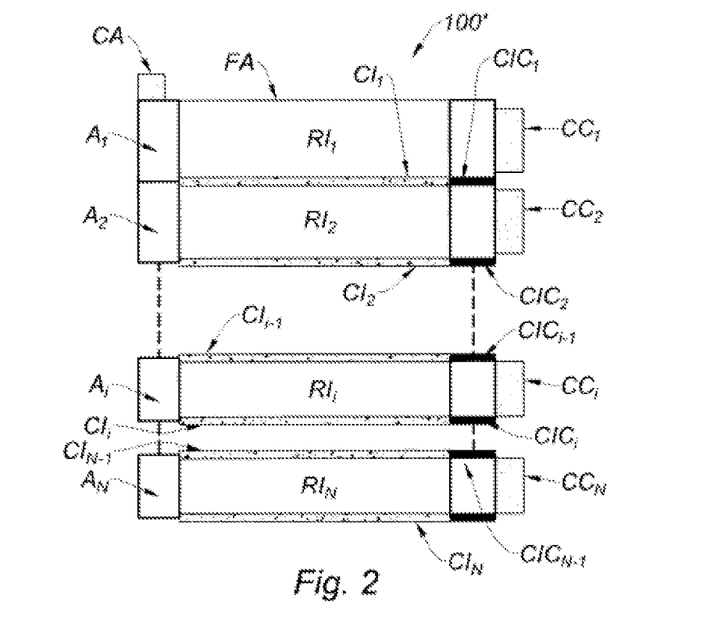
FIG. 2 illustrates a second embodiment of a multi-spectral sensor in accordance with the invention.

A second embodiment of the invention is illustrated in FIG. 2.

It differs from the first embodiment by the presence, within the multi-spectral photodetector 100', between two consecutive photodetectors $P_i$, $P_{i+1}$, where $1 \leq i \leq N-1$, in the stack, of an additional insulating layer $CI_1, CI_2, \ldots, CI_{i-1}, CI_i, \ldots, CI_{N-1}$ separating the regions of interest $RI_i$ that face each other.

The purpose of such an insulating layer is to limit the passage of charge carriers from one photodetector to another within the stack. Its effect is to confine the carriers in the photodetector $P_i$ in which they are photogenerated. Consequently, it can limit the leaking of carriers (more commonly known as "crosstalk") between the different photodetectors $P_1, \ldots, P_N$.

Such a $CI_N$ layer can also be provided at the bottom of the stack.

Indeed, the photocarriers generated by the interaction between the incident radiation and a region of interest $RI_i$ of a photodetector $P_i$ are accelerated by the electric field (horizontal, orientated in the direction perpendicular to that defined for the depth P of a photodetector) applied between the anode $A_i$ and the cathode $C_i$ of the photodetector in question in order to contribute to the electrical signal circulating in this photodetector.

However, the collisions suffered by the photocarriers during their crossing of the SCR (between the anode and cathode associated with the photodetector $P_i$) can give rise to a problem of scattering, in the particular case where the horizontal gradient of the potential is low. This scattering may mean that certain photocarriers generated in the photodetector $P_i$ are then found in another photodetector of the stack.

Furthermore, if the structure of the multi-spectral sensor 100 is such that it creates a vertical potential gradient, the photogenerated carriers in the various photodetectors $P_1, \ldots, P_N$ can be deflected from their horizontal trajectory and can mix.

This can degrade the selectivity of the spectral response of each photodetector of the stack (ability to separate different wavelengths).

In order to produce such a layer, the simplest approach is, once a photodetector $P_N$ has been produced (cf. above), to carry out an ion implantation providing a doping over a given thickness, for example P-type doping, in the region of interest $RI_N$.

This is then repeated for each photodetector $P_{N-1}$ to $P_1$.

Figure 3:
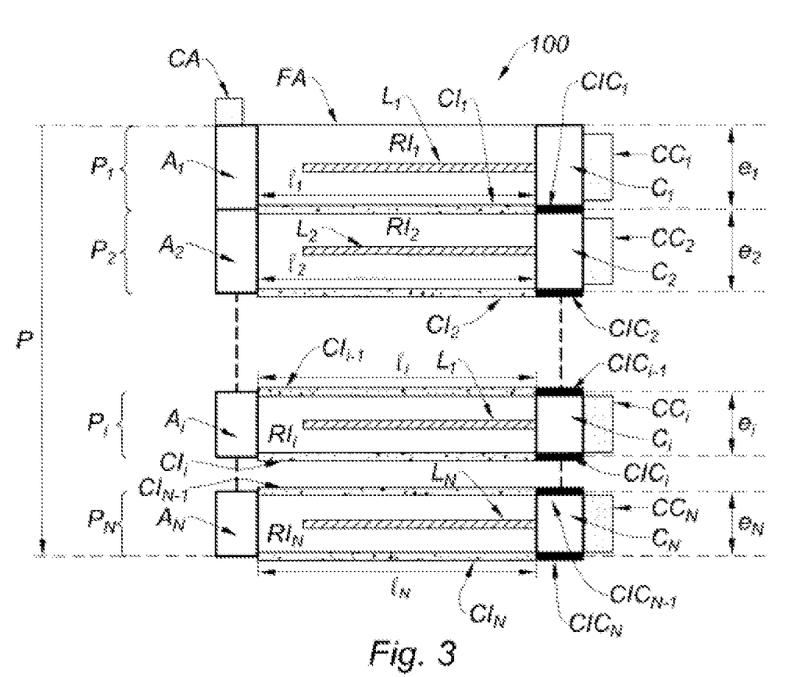
FIG. 3 illustrates a third embodiment of a multi-spectral sensor in accordance with the invention.

A third embodiment is illustrated in FIG. 3.

The third embodiment differs from the second embodiment through the presence, in a region of interest $RI_i$, where i is chosen between 1 and N, but advantageously and as illustrated in FIG. 3, in each of these regions of interest $R_i$, of a strip, $L_1, L_2, \ldots, L_i, \ldots, L_N$. This or each strip is in contact with the corresponding cathode $C_i$ and extends towards the corresponding anode $A_i$. It can be envisaged that this strip comes into contact with the corresponding anode, even of this is not compulsory, as is illustrated in FIG. 3 in which the strip $L_i$ is not in contact with the anode $A_i$. This or each strip is produced with the same type of doping as the corresponding cathode, but with a lower doping.

The interest of such a strip L resides in the fact that it enables the photogenerated carriers to be better confined in the or each photodetector $P_i$ concerned. Consequently, this makes it possible, in use, to have an SCR extending as far as possible over the length $l_i$ by reducing the reverse bias applied between the anode and the cathode. The energy consumption is therefore reduced.

To this end, a strip $L_i$ advantageously has a thickness (defined depending on the depth P of the multi-spectral sensor) of between 10 nm and 50 nm.

Of course, it is also possible to envisage a variant embodiment including such strips, by adding these strips starting from the first embodiment. In this case, the diagram of FIG. 3 results, but without the insulating layers $CI_1, CI_2, \ldots, CI_{i-1}, C_i, \ldots, CI_{N-1}$ between the regions of interest $RI_1, RI_2, \ldots, RI_{i-1}, R_i, \ldots, RI_{N-1}$ which follow one another in the stack, even without the layer $CI_N$.

Figure 4:
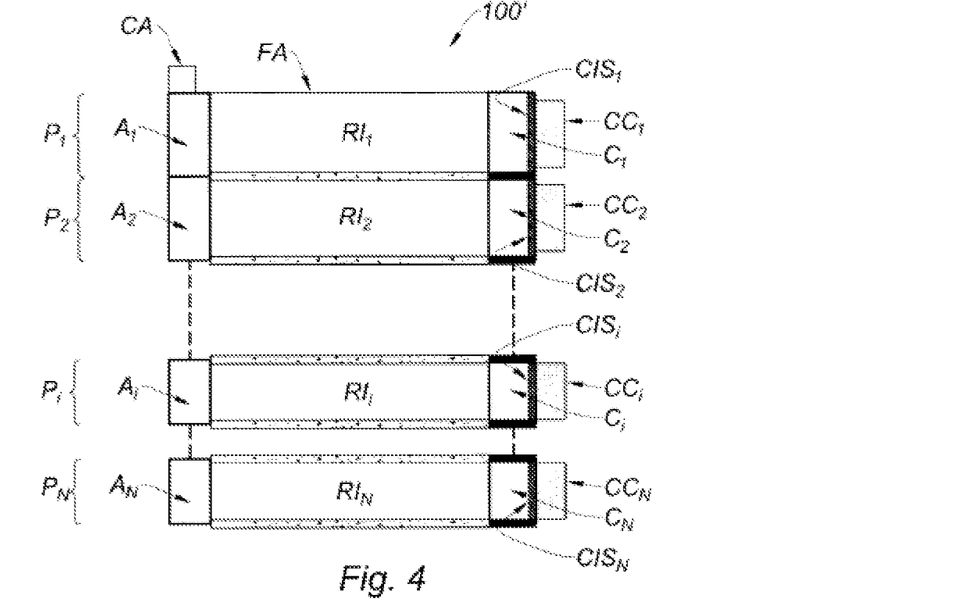
FIG. 4 illustrates a fourth embodiment of a multi-spectral sensor in accordance with the invention.

A fourth embodiment is illustrated in FIG. 4.

This fourth embodiment differs from the first embodiment through the presence of an electrically insulating layer $CIS_1, \ldots, CIS_N$ between each electrical contact $CC_1, \ldots, CC_N$ and the associated cathode $C_1, \ldots, C_N$.

This makes it possible to form a capacitor between the electrical contact and the associated cathode. Advantageously, this electrically insulating layer $CIS_1, \ldots, CIS_N$ is produced with an oxide. In particular, if the electrical contact is made from a metal or a degenerately doped polycrystal (poly-Si, for example), a MOS (Metal-Oxide-Semiconductor) capacitor is then formed.

In this embodiment, the cathode $C_1, \ldots, C_N$ of each photodetector $P_1, \ldots, P_N$ forms a potential well in which the charges generated during the insulation time of the multi-spectral photodetector 100" are accumulated These accumulated charges can then be transferred, when this is desired, to a reading device (not illustrated) by applying an appropriate voltage on the MOS capacitor.

The value of the capacitance of the MOS capacitor depends on the thickness of the electrically insulating layer and on its surface area. Its surface area will be related to the thickness $e_i$ of a photodetector $P_1, \ldots, P_N$ of the stack. Furthermore, and typically, the electrically insulating layer $CIS_1, \ldots, CIS_N$ will have a thickness between 2 nm and 50 nm.

It is understood that with this fourth embodiment, each photodetector $P_1, \ldots, P_N$ of the stack constitutes a CCD photodetector (acronym meaning "Charge Coupled Device").

With the design proposed in this fourth embodiment, a multi-spectral photodetector 100" is therefore defined which can be classed with the CCD technologies, but with all the advantages achieved by the design proposed in the context of the invention.

In practice, the epitaxy of the multi-spectral sensor $P_1, P_2, \ldots, P_i, \ldots, P_N$ is performed first. A trench is then produced on the epitaxial thickness, at the desired location, through a mask. The side of the produced trench is then oxidised, advantageously by a thermal oxidation, and a metal gate is deposited for each photodetector $P_i$. This gate is advantageously made of degenerately doped polycrystal, such as doped polysilicon.

Advantageously, a single layer of polysilicon serves as the gate for all of the photodetectors $P_i$.

In a variant, the gates of the photodetectors $P_i$ are separated from each other by insulating layers. In this case, the gate of the photodetector $P_N$ is deposited first, followed by the deposition of an insulating layer. These steps are then repeated for each of the photodetectors $P_{N-1}$ to $P_1$.

This is advantageously carried out after the doping aimed at forming the anode and the cathode.

In practice, the following dielectrics can be envisaged in the case of silicon for producing the electrically insulating layer: silicon oxide ($SiO_2$) or silicon nitride ($Si_3N_4$).

This fourth embodiment can of course include the layers $CI_1, \ldots, CI_N$ of the embodiment of FIG. 2, and this is moreover what is illustrated in FIG. 4. As a variant, it can also include the strips described in support of FIG. 3.

However, in the context of the invention, it is not compulsory to provide the layers $CI_1, \ldots, CI_N$ (case not illustrated).

Figure 5:
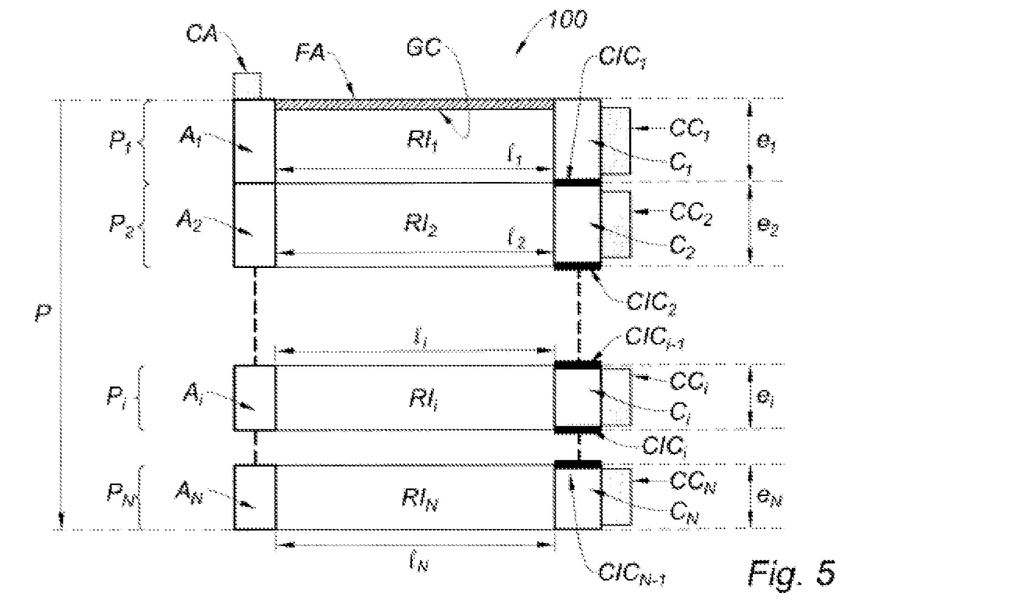
FIG. 5 illustrates a variant embodiment, in this case illustrated with respect to the first embodiment, but applicable to all four embodiments of FIGS. 1 to 4.

FIG. 5 represents a variant applicable to the four embodiments described above.

It is however supplied with reference to the first embodiment.

In this variant, a concentration gradient GC is provided in the doping of the semiconductor material of the region of interest $RI_1$ of the first photodetector $P_1$ of the stack, at the active face FA.

This can be produced either by implanting impurities at the surface or by diffusion of impurities from a doped layer deposited at the surface.

The purpose of this concentration gradient is to increase the quantum efficiency in the first region of interest $RI_1$, dedicated to the shortest wavelength of interest. Indeed, due to this concentration gradient, the photogenerated charges are remote from the recombination centres close to the active face FA.

Figure 6:
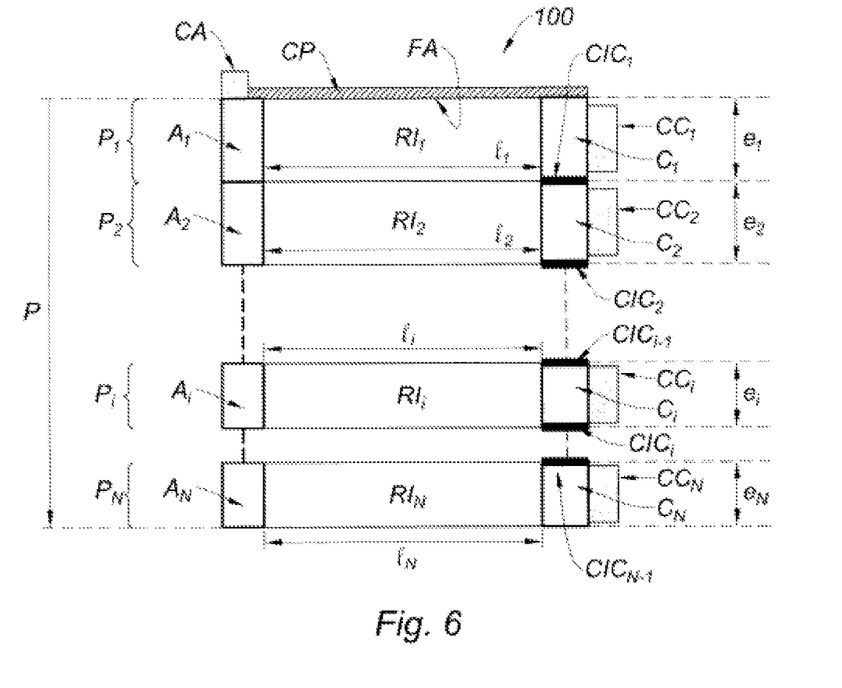
FIG. 6 illustrates another variant embodiment, in this case represented with respect to the first embodiment, but applicable to all four embodiments of FIGS. 1 to 4 and to the variant embodiment of FIG. 5.

FIG. 6 represents another variant applicable to the four embodiments described above.

It is however supplied with reference to the first embodiment.

In this variant, the multi-spectral photodetector comprises a passivation layer CP on the active face FA.

The passivation layer CP can be produced with an oxide or glass comprising phosphorus.

This passivation layer can protect the multi-spectral detector against possible attack from the external environment (for example, humidity or corrosion).

It also makes it possible to reduce the interface states at the active face. Indeed, the atoms in the first atomic layer of the material of the first photodetector $P_1$ have incomplete or pendent bonds at the active face, for example for a $Si/SiO_2$ interface. In the absence of a passivation layer, these pendent bonds constitute recombination centres which reduce the quantum efficiency and generate noise.

They can also retain ionic charge defects, in particular when a phosphosilicate glass is used in order to form this passivation layer CP.

Finally, according to another variant, it will be possible to provide, regardless of the envisaged embodiment, both a concentration gradient as illustrated in FIG. 5 and a passivation layer as illustrated in FIG. 6.

EXAMPLE

Figure 7:
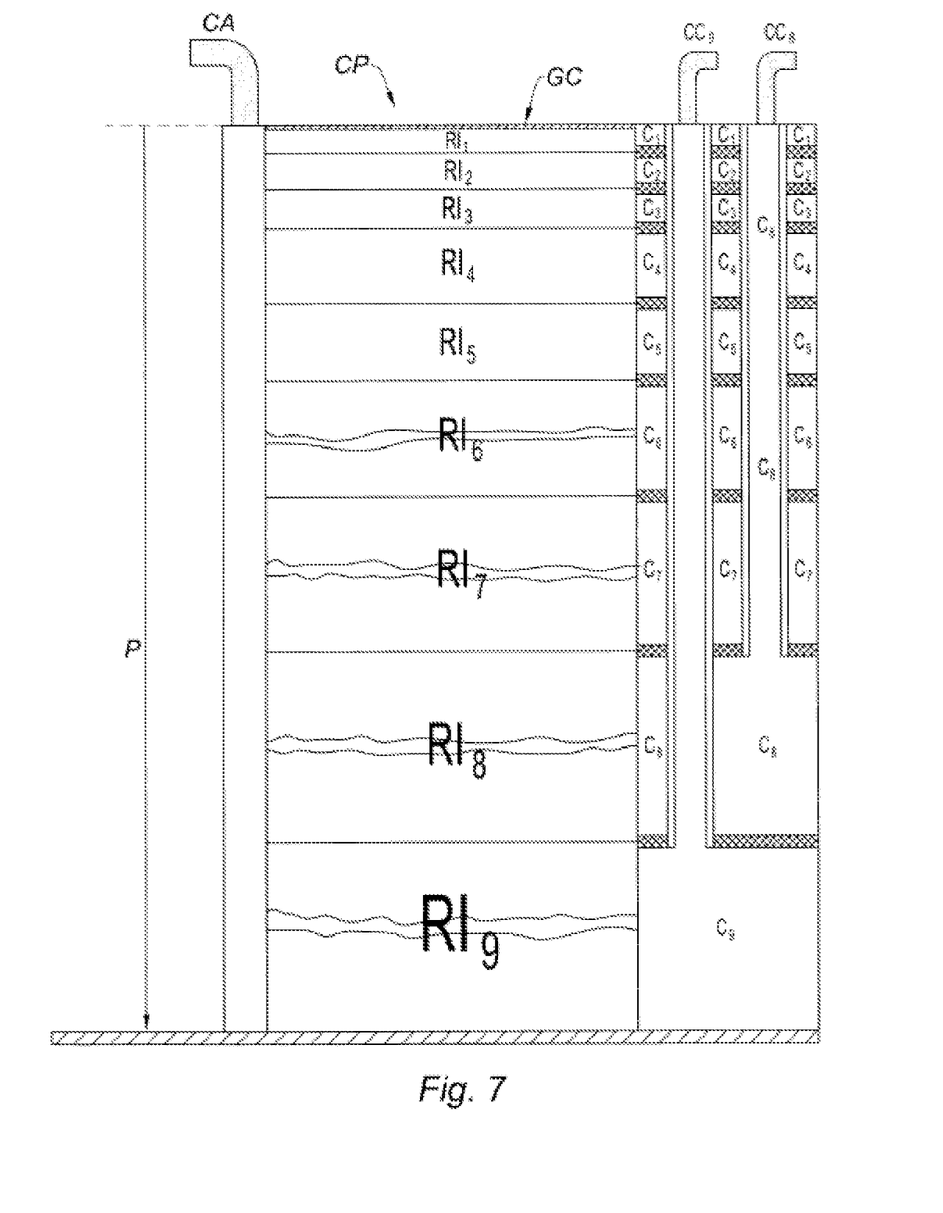
FIG. 7 illustrates a multi-spectral sensor according to the invention which has been the subject of numerical stimulations in order to test its effectiveness.

This example is based on the structure of FIG. 5, with N=9 stacked photodetectors. However, FIG. 7 illustrates the structure of the multi-spectral sensor more precisely for this example. In particular, the production of the various contacts is illustrated.

Table 1 below lists, for each photodetector $P_i$, its width $l_i$ and its thickness $e_i$, where $1 \leq i \leq 9$. The depth $d_i$ of each photodetector $P_i$ can be deduced from the cumulated values of the thicknesses of each photodetector which precedes it in the stack.

TABLE 1

| Photodetector | $l_i$ (microns) | $e_i$ (nm) |
| --- | --- | --- |
| P1 | 1 | 50 |
| P2 | 1 | 100 |
| P3 | 1 | 100 |
| P4 | 1 | 200 |
| P5 | 1 | 200 |
| P6 | 1 | 300 |
| P7 | 1 | 2000 |
| P8 | 1 | 3000 |
| P9 | 1 | 3000 |

The active face FA has a surface area of 1 $\mu m^2$. Since $l_i$ has a value of 1 micron, this means that the active face has a square shape in a plane perpendicular to the plane of the drawing of FIG. 7.

The photodetectors are made of silicon.

Description of the Method of Production

The method starts from a silicon substrate, P doped with $10^{15}$ atoms per $cm^3$.

Boron is implanted over the entire surface with a dose such that the doping is $5.10^{17}$ $cm^{-3}$ over a thickness of 30 nm.

Production of the (Deepest) Photodetector $P_9$, with Thickness $e_9=3$ µm

Epitaxy of a layer of crystalline silicon doped with $10^{14}$ at·$cm^{-3}$ of boron over a thickness of 1.5 µm.

Defining using a mask, by a deposition of photosensitive resin and photolithography, anode and cathode areas.

Implanting P+ and N+ respectively through these masks, with doping equal to at least $10^{19}$ at·$cm^{-3}$.

Epitaxy of a layer of crystalline silicon doped with $10^{14}$ at·$cm^{-3}$ of boron over a thickness of 1.485 µm.

Defining using a mask, by deposition of photosensitive resin and photolithography, anode and cathode areas.

Implanting P+ (anode) and N+ (cathode) respectively through these masks, with doping equal to at least $10^{19}$ at·$cm^{-3}$.

Epitaxy of a layer of crystalline silicon doped with $10^{14}$ at·$cm^{-3}$ of boron over a thickness of 30 nm.

Defining the anode area by using the same mask as previously and implanting P+ with $10^{19}$ at·$cm^{-3}$.

Defining the implantation area for insulation of the cathodes (layer $CIC_{N-1}$) and the column allowing the cathode $C_9$ to rise up to the active face FA. The P+ implanted insulation region should then be defined with a mask, by a deposition of photosensitive resin and photolithography. A P+ implantation with $10^{20}$ at·$cm^{-3}$ is produced through this mask. This implantation has a thickness of 30 nm.

Another mask enables the N+ region with $10^{19}$ at·$cm^{-3}$ to be defined, which constitutes the column corresponding to $C_9$.

Production of the Photodetector $P_8$, with Thickness $e_8=3$ µm

Epitaxy of a layer of crystalline silicon doped with $10^{14}$ at·$cm^{-3}$ of boron over a thickness of 1.5 µm.

Defining using a mask, by a deposition of photosensitive resin and photolithography, anode and cathode areas and the insulating crown in the region of the cathode which surrounds the rising column of $C_9$. Implanting anode and cathode P+ and N+ respectively, through the masks, with doping equal to at least $10^{19}$ at·$cm^{-3}$.

Implanting through the insulating crown of the P+ doped with $10^{20}$ at·$cm^{-3}$.

Epitaxy of a layer of crystalline silicon doped with $10^{14}$ at·$cm^{-3}$ of boron over a thickness of 1.47 µm.

Defining using a mask, by a deposition of photosensitive resin and photolithography, anode and cathode areas and the insulating crown in the region of the cathode which surrounds the rising column of $C_9$.

Implanting anode and cathode P+ and N+ respectively, through the masks, with doping equal to at least $10^{19}$ at·$cm^{-3}$.

Implanting through the insulating crown of the P+ doped with $10^{20}$ at·$cm^{-3}$.

Epitaxy of a layer of crystalline silicon doped with $10^{14}$ at·$cm^{-3}$ of boron over a thickness of 30 nm.

Defining the anode area y using the same mask as previously and implanting P+ with $10^{19}$ at·$cm^{-3}$.

Defining the implantation area for insulation of the cathodes and the columns allowing the cathodes $C_8$ and $C_9$ to rise up to the active surface FA. The P+ implanted insulation region should then be defined with a mask, by a deposition of photosensitive resin and photolithography. A P+ implantation with $10^{20}$ at·cm$^{-3}$ is produced through this mask. This implantation has a thickness of 30 nm.

Another mask enables the N+ regions with $10^{19}$ at·cm$^{-3}$ to be defined, which constitute the columns corresponding to $C_8$ and $C_9$.

Production of the Photodetector $P_7$, with Thickness $e_7=2$ μm

Epitaxy of a layer of crystalline silicon doped with $10^{14}$ at·cm$^{-3}$ of boron over a thickness of 1 μm.

Defining using a mask, by a deposition of photosensitive resin and photolithography, anode and cathode areas and the insulating crowns in the region of the cathode which surround the rising columns of $C_8$ and $C_9$.

Implanting anode and cathode P+ and N+ respectively, through the masks, with doping equal to at least $10^{19}$ at·cm$^{-3}$.

Implanting through the insulating crowns of the P+ doped with $10^{20}$ at·cm$^{-3}$.

Epitaxy of a layer of crystalline silicon doped with $10^{14}$ at·cm$^{-3}$ of boron over a thickness of 0.97 μm.

Defining using a mask, by a deposition of photosensitive resin and photolithography, anode and cathode areas and the insulating crowns in the region of the cathode which surround the rising columns of $C_8$ and $C_9$.

Implanting anode and cathode P+ and N+ respectively, through the masks, with doping equal to at least $10^{19}$ at·cm$^{-3}$.

Implanting through the insulating crowns of the P+ doped with $10^{20}$ at·cm$^{-3}$.

Epitaxy of a layer of crystalline silicon doped with $10^{14}$ at·m$^{-3}$ of boron over a thickness of 30 nm.

Defining the anode area by using the same mask as previously and implanting P+ at $10^{19}$ at·cm$^{-3}$.

Defining the implantation area for insulation of the cathodes and the columns allowing the cathodes $C_7$, $C_8$ and $C_9$ to rise up to the active surface FA. The P+ implanted insulation region should then be defined with a mask, by a deposition of photosensitive resin and photolithography. A P+ implantation with $10^{20}$ at·cm$^{-3}$ is carried out through this mask. This implantation has a thickness of 30 nm.

Another mask enables the N+ regions with $10^{19}$ at·cm$^{-3}$ to be defined, which constitute the columns corresponding to $C_7$, $C_8$ and $C_9$.

Production of the Photodetector $P_6$, with Thickness $e_6=300$ nm

Epitaxy of a layer doped with $10^{14}$ at·m$^{-3}$ of boron over a thickness of 270 nm.

Defining using a mask, by a deposition of photosensitive resin and photolithography, anode and cathode areas and the insulating crowns in the region of the cathode which surround the rising columns of $C_7$, $C_8$ and $C_9$.

Implanting anode and cathode P+ and N+ respectively, through the masks, with doping equal to at least $10^{19}$ at·cm$^{-3}$.

Implanting through the insulating crowns of the P+ doped with $10^{20}$ at·cm$^{-3}$.

Epitaxy of a layer of crystalline silicon doped with $10^{14}$ at·m$^{-3}$ of boron over a thickness of 30 nm.

Defining the anode area by using the same mask as previously and implanting P+ with $10^{19}$ at·cm$^{-3}$.

Defining the implantation area for insulation of the cathodes and the columns allowing the cathodes $C_6$, $C_7$, $C_8$ and $C_9$ to rise up to the active face FA. The P+ implanted insulation region should then be defined with a mask, by a deposition of photosensitive resin and photolithography. A P+ implantation with $10^{20}$ at·cm$^{-3}$ is carried out through this mask. This implantation has a thickness of 30 nm.

Another mask enables the N+ regions with $10^{19}$ at·cm$^{-3}$ to be defined, which constitute the columns corresponding to $C_6$, $C_7$, $C_8$ and $C_9$.

Production of the Photodetector $P_5$, with Thickness $e_5=200$ nm

Epitaxy of a layer doped with $10^{14}$ at·m$^{-3}$ of boron over a thickness of 170 nm.

Defining using a mask, by a deposition of photosensitive resin and photolithography, anode and cathode areas and the insulating crowns in the region of the cathode which surround the rising columns of $C_6$, $C_7$, $C_8$ and $C_9$.

Implanting anode and cathode P+ and N+ respectively, through the masks, with doping equal to at least $10^{19}$ at·cm$^{-3}$.

Implanting through the insulating crowns of the P+ doped with $10^{20}$ at·cm$^{-3}$.

Epitaxy of a layer of crystalline silicon doped with $10^{14}$ at·m$^{-3}$ of boron over a thickness of 30 nm.

Defining the anode area by using the same mask as previously and implanting P+ with $10^{19}$ at·cm$^{-3}$.

Defining the implantation area for insulation of the cathodes and the columns allowing the cathodes $C_5$, $C_6$, $C_7$, $C_8$ and $C_9$ to rise up to the active face FA. The P+ implanted insulation region should then be defined with a mask, by a deposition of photosensitive resin and photolithography. A P+ implantation with $10^{20}$ at·cm$^{-3}$ is carried out through this mask. This implantation has a thickness of 30 nm.

Another mask enables the N+ regions with $10^{19}$ at·cm$^{-3}$ to be defined, which constitute the columns corresponding to $C_5$, $C_6$, $C_7$, $C_8$ and $C_9$.

Production of the Photodetector $P_4$, with Thickness $e_4=200$ nm

Epitaxy of a layer doped with $10^{14}$ at·m$^{-3}$ of boron over a thickness of 170 nm.

Defining using a mask, by a deposition of photosensitive resin and photolithography, anode and cathode areas and the insulating crowns in the region of the cathode which surround the rising columns of $C_5$, $C_6$, $C_7$, $C_8$ and $C_9$.

Implanting anode and cathode P+ and N+ respectively, through the masks, with doping equal to at least $10^{19}$ at·cm$^{-3}$.

Implanting through the insulating crowns of the P+ doped with $10^{20}$ at·cm$^{-3}$.

Epitaxy of a layer of crystalline silicon doped with $10^{14}$ at·m$^{-3}$ of boron over a thickness of 30 nm.

Defining the anode area by using the same mask as previously and implanting P+ with $10^{19}$ at·cm$^{-3}$.

Defining the implantation area for insulation of the cathodes and the columns allowing the cathodes $C_4$, $C_5$, $C_6$, $C_7$, $C_8$ and $C_9$ to rise up to the active face FA. The P+ implanted insulation region should then be defined with a mask, by a deposition of photosensitive resin and photolithography. A P+ implantation with $10^{20}$ at·cm$^{-3}$ is carried out through this mask. This implantation has a thickness of 30 nm.

Another mask enables the N+ regions with $10^{19}$ at·cm$^{-3}$ to be defined, which constitute the columns corresponding to $C_4$, $C_5$, $C_6$, $C_7$, $C_8$ and $C_9$.

Production of the Photodetector $P_3$, with Thickness $e_3=100$ nm

Epitaxy of a layer doped with $10^{14}$ at·m$^{-3}$ of boron over a thickness of 70 nm.

Defining using a mask, by a deposition of photosensitive resin and photolithography, anode and cathode areas and insulating crowns in the region of the cathode which surround the rising columns of $C_4$, $C_5$, $C_6$, $C_7$, $C_8$ and $C_9$.

Implanting anode and cathode P+ and N+ respectively, through the masks, with doping equal to at least $10^{19}$ at·cm$^{-3}$.

Implanting through the insulating crowns of the P+ doped with $10^{20}$ at·cm$^{-3}$.

Epitaxy of a layer of crystalline silicon doped with $10^{14}$ at·m$^{-3}$ of boron over a thickness of 30 nm.

Defining the anode area by using the same mask as previously and implanting P+ with $10^{19}$ at·cm$^{-3}$.

Defining the implantation area for insulation of the cathodes and the columns allowing the cathodes $C_3$, $C_4$, $C_5$, $C_6$, $C_7$, $C_8$ and $C_9$ to rise up to the active face FA. The P+ implanted insulation region should then be defined with a mask, by a deposition of photosensitive resin and photolithography. A P+ implantation with $10^{20}$ at·cm$^{-3}$ is carried out through this mask. This implantation has a thickness of 30 nm.

Another mask enables the N+ regions with $10^{19}$ at·cm$^{-3}$ to be defined, which constitute the columns corresponding to $C_3$, $C_4$, $C_5$, $C_6$, $C_7$, $C_8$ and $C_9$.

Production of the Photodetector $P_2$, with Thickness $e_2$=100 nm

Epitaxy of a layer doped with $10^{14}$ at·m$^{-3}$ of boron over a thickness of 70 nm.

Defining using a mask, by a deposition of photosensitive resin and photolithography, anode and cathode areas and the insulating crowns in the region of the cathode which surround the rising columns of $C_3$, $C_4$, $C_5$, $C_6$, $C_7$, $C_8$ and $C_9$.

Implanting anode and cathode P+ and N+ respectively, through the masks, with doping equal to at least $10^{19}$ at·cm$^{-3}$.

Implanting through the insulation crowns of the P+ doped with $10^{20}$ at·cm$^{-3}$.

Epitaxy of a layer of crystalline silicon doped with $10^{14}$ at·m$^{-3}$ of boron over a thickness of 30 nm.

Defining the anode area by using the same mask as previously and implanting P+ with $10^{19}$ at·cm$^{-3}$.

Defining the implantation area for insulation of the cathodes and the columns allowing the cathodes $C_2$, $C_3$, $C_4$, $C_5$, $C_6$, $C_7$, $C_8$ and $C_9$ to rise up to the active face FA. The P+ implanted insulation region should then be defined with a mask, by a deposition of photosensitive resin and photolithography. A P+ implantation with $10^{20}$ at·cm$^{-3}$ is carried out through this mask. This implantation has a thickness of 30 nm.

Another mask enables the N+ regions with $10^{19}$ at·cm$^{-3}$ to be defined, which constitute the columns corresponding to $C_2$, $C_3$, $C_4$, $C_5$, $C_6$, $C_7$, $C_8$ and $C_9$.

Production of the Photodetector $P_1$, with Thickness $e_1$=50 nm

Epitaxy of a layer doped with $10^{14}$ at·m$^{-3}$ of boron over a thickness of 35 nm.

Defining using a mask, by a deposition of photosensitive resin and photolithography, anode and cathode areas and the insulating crowns in the region of the cathode which surround the rising columns of $C_2$, $C_3$, $C_4$, $C_5$, $C_6$, $C_7$, $C_8$ and $C_9$.

Implanting anode and cathode P+ and N+ respectively, through the masks, with doping equal to at least $10^{19}$ at·cm$^{-3}$.

Implanting through the insulation crowns of the P+ doped with $10^{20}$ at·cm$^{-3}$.

Implanting a Concentration Gradient (GA) at the Active Face FA.

Implanting, over the entire active face FA, a P doping with $10^{17}$ at·cm$^{-3}$.

Producing the Passivation Layer (CP)

A first thermal treatment is carried out for activating the dopants in the various epitaxies. This treatment can be "fast rtp" type at 1000° C. For example, a temperature rise ("Ramp-up") can be carried out from 600° C. to 1000° C. at 300° C./min under neutral atmosphere. There is then a plateau of 30 seconds in a slightly oxidising atmosphere (90% nitrogen and 10% oxygen) at 1000° C. Then a temperature reduction ("Ramp down") is carried out at 300° C./min to 600° C. under neutral atmosphere. Finally, a deposition of phosphosilicate glass (PSG: SiO2 with 8% phosphorus) of thickness 500 nm is performed, followed by an anneal at 600° C. for 30 minutes under an atmosphere of 90% $N_2$ and 10% $H_2$.

Metallisation and Definition of Contacts

This step is used to make contact with each of the cathodes in order to connect them to the reader electronics intended to be produced on the same chip. It also makes it possible to connect the anode and to fix the biases required for the operation of the multi-spectral sensor 100.

End of the production method.

It should be noted that, as previously indicated, the manufacturing method described above is compatible with "planar" technologies for manufacturing CI, CMOS or BiC-MOS, because of the way in which the bond and insulation between the different cathode contacts is made.

Figure 8:
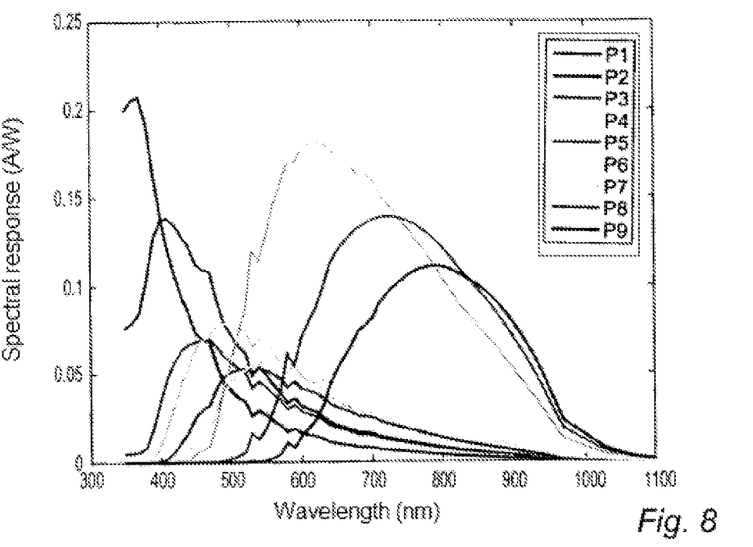
FIG. 8 illustrates the spectral response of the multi-spectral sensor of FIG. 7.

FIG. 8 illustrates the spectral response curves, obtained by numerical simulation, of the multi-spectral sensor of FIG. 7.

In practice however, in order that this functions, a bias of between 5 V and 10 V should probably be applied between the anode and the cathode.

Another Example

A multi-spectral sensor conforming with that of FIG. 7, but also having strips $L_i$ and insulating layers $CI_i$ between the regions of interest, as proposed in FIG. 3, has also been simulated.

The method for manufacturing such a structure would be similar to that previously described for producing the structure of FIG. 7, with the exception of the fact that a strip should be provided in each photodetector as well as the insulating layer between regions of interest.

To this effect, each strip $L_i$ has a thickness of 20 nm.

For this purpose, the epitaxy of the photodetector $P_i$ is made in several steps. The epitaxy of the photodetector is carried out as in the case of the photodetector $P_9$ of the preceding example. Then, a mask is defined by a deposition of photosensitive resin and photolithography for the anode, the cathode and the strip area. Then, an ion implantation is performed through the mask corresponding to each region. For the strip, the implantation can be made with a doping of the same type as that of the cathode, but less than that of the cathode. The epitaxy then continues up to the targeted thickness for the photodetector $P_N$. Finally, the insulating implantations are performed (cathode and region of interest).

This is repeated for each photodetector of the stack

Such a multi-spectral sensor only needs a weak reverse bias between the anode and the cathode. In the present case, the particular structure previously described can operate with a zero reverse bias (0 Volt).

Figure 9:
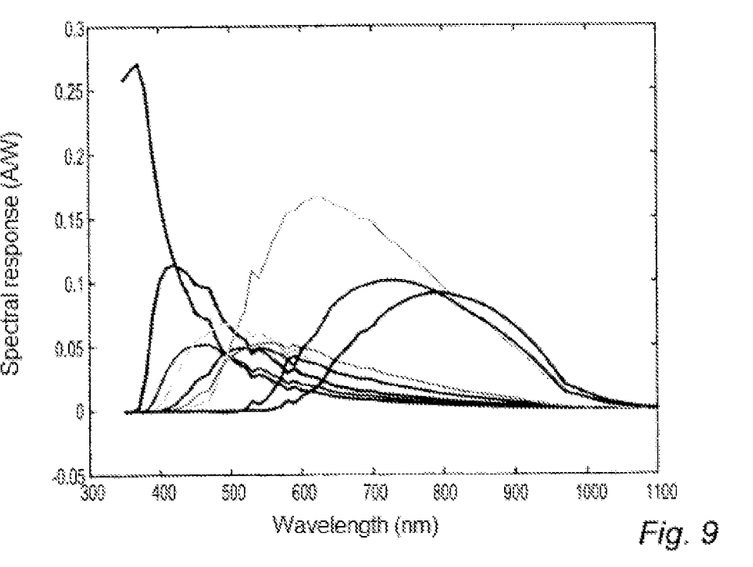
FIG. 9 illustrates the spectral response of the multi-spectral sensor of FIG. 3.

FIG. 9 illustrates the spectral response curves obtained by numerical simulation of such a multi-spectral sensor.

It should be noted that in all the embodiments described above, including variants, the multi-spectral sensor is designed to recover the photogenerated charges at the cathode of the photodetector in question.

This explains why one contact $CC_i$ is provided per cathode $C_i$. This also explains why a common contact $C_A$ can be provided for all the anodes.

However, it is perfectly possible to provide one anode contact per anode (not illustrated).

Furthermore, a multi-spectral sensor according to the invention can recover the charges photogenerated in each photodetector $P_i$ in the anodes.

Figure 10:
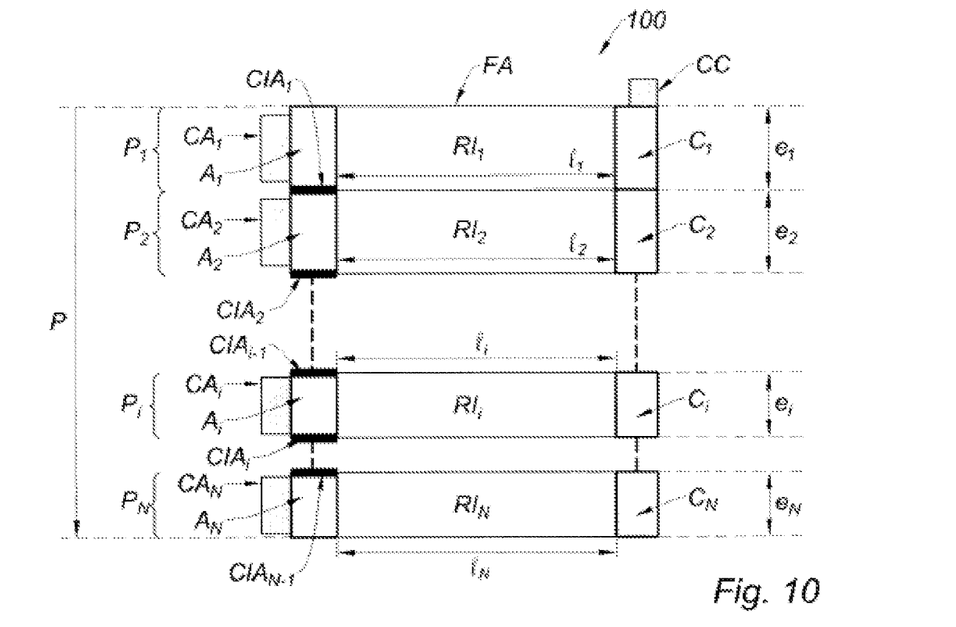
FIG. 10 illustrates another embodiment, to be compared with that of FIG. 1.

In this case, and as illustrated in FIG. 10, as many anode contacts $CA_1, CA_2, \ldots, CA_i, CA_N$ should be provided as there are anodes. The insulating layers $CIA_1, CIA_2, \ldots, CIA_{i-1}, CIA_i, \ldots, CIA_{N-1}$ are therefore provided between the anodes which face each other in the stack.

In this case too, it is possible to provide a common contact CC for the cathodes, even though, of course, one contact per cathode can be provided.

FIG. 10 is to be compared with FIG. 1.

This modification has no impact on the operation of the multi-spectral sensor according to the invention. Indeed, it simply involves here an alternative design for recovering the charges photogenerated by the photodetector in question.

For this reason, the invention also relates to a multi-spectral sensor 100 comprising:

a plurality of N photodetectors $P_1, \ldots, P_N$ where N is an integer such that N≥2, each photodetector comprising an anode $A_1, \ldots, A_N$ and a cathode $C_1, \ldots, C_N$ separated from each other by a region of interest $R_{I1}, \ldots, R_{IN}$, the anode, the cathode and the region of interest all being made of a semiconductor material;

said photodetectors being stacked on top of one another so that the anodes $A_1, \ldots, A_N$ and the cathodes $C_1, \ldots, C_N$ and finally the regions of interest $R_{I1}, \ldots, R_{IN}$ of two consecutive photodetectors in the stack are arranged face to face, this stack making it possible to define a face, termed the active face FA of the multi-spectral sensor, common to all the photodetectors of the stack, defined by the face of the first region of interest $RI_1$ of the first photodetector $P_1$ of the stack, via which photons are intended to enter the stack;

an electrical contact $CA_1, \ldots, CA_N$ associated with each of the N anodes, the consecutive anodes in the stack, arranged face-to-face, then being separated by an insulating layer $CIA_1, \ldots, CIA_N$; and at least one electrical contact CC for the N cathodes, the consecutive anodes in the stack, arranged face-to-face.

All the other embodiments described with the support of FIGS. 2 to 6 are also applicable, mutadis mutandis, to the case of FIG. 10.

In particular, it is entirely conceivable that each photodetector $P_i$ comprises, within its associated region of interest $R_i$, a strip $L_i$ at least in contact with the anode $A_i$ concerned and produced with a doping of the same type as that of this anode $A_i$, said strip $L_i$ extending, within the region of interest $R_i$, towards the cathode $C_i$.

In this case, the strip $L_i$ has the same function as that described above.

Figure 11:
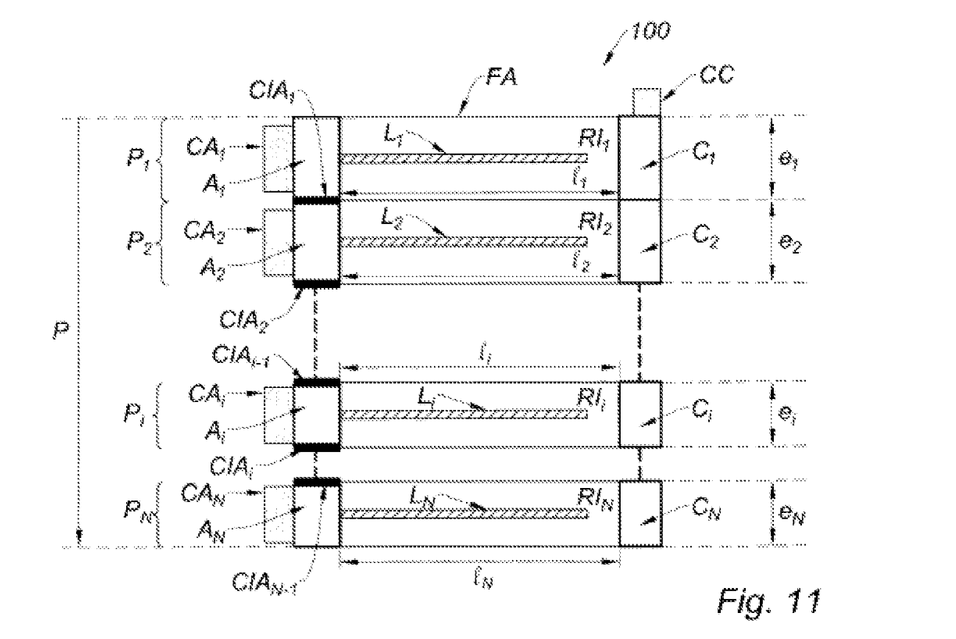
FIG. 11 illustrates another embodiment, to be compared with that of FIG. 3.

This is illustrated in FIG. 11.

In order to produce such a strip, in particular a lower doping than that of the corresponding anode can be provided.

Finally, a multi-spectral sensor can be envisaged in which an electrical contact $CC_i$ is provided for each cathode $C_i$ and an electrical contact $CA_i$ for each anode $A_i$, and both insulating layers $CIA_i$ between both the anodes which face each other in the stack as well as insulating layers $CC_i$ between the cathodes which face each other.

The invention claimed is:

1. A multi-spectral sensor comprising:
a plurality of N photodetectors where N is an integer such that N≥2, each photodetector comprising an anode and a cathode separated from each other by a region of interest, the anode, the cathode and the region of interest all being made of a semiconductor material;
said photodetectors being stacked on top of one another so that anodes and cathodes and finally regions of interest of two consecutive photodetectors in a stack are arranged face to face, the stack making it possible to define a face, termed an active face of the multi-spectral sensor, common to all the photodetectors of the stack, defined by the face of a first region of interest of a first photodetector of the stack via which photons are intended to enter the stack; and
either, in a first case, an electrical contact associated with each of N cathodes and at least one electrical contact for N anodes, consecutive cathodes in the stack, arranged face-to-face, then being separated by an insulating layer;
or, in a second case, an electrical contact associated with each of the N anodes and at least one electrical contact for the N cathodes, consecutive anodes in the stack, arranged face-to-face, then being separated by the insulating layer.

2. The multi-spectral sensor according to claim 1, comprising, between the two consecutive photodetectors in the stack, an insulating layer separating the regions of interest arranged face-to-face.

3. The multi-spectral sensor according to claim 1, wherein each photodetector comprises, within an associated region of interest, a strip which is:
in the first case, at least in contact with the cathode produced with a doping of a same type as this cathode, said strip extending, within the region of interest, towards the anode;
in the second case, at least in contact with the anode produced with a doping of a same type as this anode, said strip extending, within the region of interest, towards the cathode.

4. The multi-spectral according to claim 3, wherein the strip has a thickness between 10 nm and 50 nm.

5. The multi-spectral sensor according to claim 1, having a concentration gradient in doping of the semiconductor material of the region of interest of the first photodetector of the stack, situated at said active face.

6. The multi-spectral sensor according to claim 1, further comprising a passivation layer on said active face.

7. The multi-spectral sensor according to claim 6, wherein the passivation layer is produced with an oxide or glass comprising phosphorus.

8. The multi-spectral sensor according to claim 1, wherein the insulating layer is provided, for example produced using an oxide:
in the first case, between each electrical contact of the cathode and an associated cathode in order to form a capacitor between the electrical contact of the cathode and the associated cathode;
in the second case, between each electrical contact of the anode and an associated anode in order to form a capacitor between the electrical contact of the anode and the associated anode.

9. The multi-spectral according to claim 1, wherein, for each photodetector, the region of interest is produced from an intrinsically doped semiconductor material.

10. The multi-spectral sensor according to claim 1, wherein, for each photodetector:
the anode is produced from a P+ doped semiconductor material;
the cathode is produced from an N+ doped semiconductor material.

\* \* \* \* \*